United States Patent
Singer et al.

(10) Patent No.: US 8,411,715 B2
(45) Date of Patent: Apr. 2, 2013

(54) SEMICONDUCTOR LASER DEVICE

(75) Inventors: Frank Singer, Regenstauf (DE);
Thomas Schwarz, Regensburg (DE);
Ulrich Steegmüller, Regensburg (DE);
Roland Schulz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/809,677

(22) PCT Filed: Nov. 19, 2008

(86) PCT No.: PCT/DE2008/001910
§ 371 (c)(1),
(2), (4) Date: Oct. 18, 2010

(87) PCT Pub. No.: WO2009/079968
PCT Pub. Date: Jul. 2, 2009

(65) Prior Publication Data
US 2011/0032962 A1 Feb. 10, 2011

(30) Foreign Application Priority Data
Dec. 21, 2007 (DE) .................. 10 2007 062 044

(51) Int. Cl.
*H01S 3/04* (2006.01)
*H01S 5/00* (2006.01)
(52) U.S. Cl. ......... 372/36; 372/34; 372/43.01; 372/50.1
(58) Field of Classification Search ........... 372/38.1, 372/50.121, 50.122, 36, 38.01, 65, 103, 34, 372/38.02, 43.01, 50.1
See application file for complete search history.

(56) References Cited

U.S. PATENT DOCUMENTS 6,021,844 A 2/2000 Batchelder
6,451,152 B1 9/2002 Holmes et al.
(Continued)

FOREIGN PATENT DOCUMENTS

EP 1 603 206 12/2005
EP 1 744 415 1/2007
(Continued)

OTHER PUBLICATIONS

W. Pittroff et al., "Mounting of laser bars on copper heat sinks using Au/Sn solder and CuW submounts", 2002 Proceedings 52$^{nd}$ Electronic Components and Technology Conference, San Diego, CA, May 28-31, 2002; vol. 52, pp. 276-281.

*Primary Examiner* — Armando Rodriguez
(74) *Attorney, Agent, or Firm* — Cozen O'Connor

(57) ABSTRACT

The invention relates to a semiconductor laser device comprising a laser bar (2), a flexible conductor support (10), a supporting body (3) of a metal or a metal alloy and a heat sink (4), which is arranged between the supporting body (3) and the laser bar (2), the laser bar (2) being electrically contacted by the flexible conductor support (10) and the supporting body (3) having a thickness of at least 2 mm. The invention further relates to a method for producing the above-described semiconductor laser device, wherein a synchronous soldering process is used to solder the laser bar (2) to the heat sink (4) by means of a hard solder layer (30) and the heat sink (4) to the supporting body (3) by means of a further hard solder layer (31).

20 Claims, 4 Drawing Sheets

U.S. PATENT DOCUMENTS

| | | |
|---|---|---|
| 7,502,399 B2 | 3/2009 | Ferstl |
| 2003/0007750 A1 | 1/2003 | Kryzak |
| 2004/0120660 A1 | 6/2004 | Go et al. |
| 2004/0146253 A1 | 7/2004 | Wang et al. |
| 2004/0179562 A1 | 9/2004 | Carroll et al. |
| 2005/0069266 A1* | 3/2005 | Kouta et al. .................... 385/92 |
| 2005/0135777 A1* | 6/2005 | Aronson et al. ............. 385/147 |
| 2005/0161813 A1* | 7/2005 | Pammer et al. .............. 257/737 |
| 2005/0175312 A1 | 8/2005 | Tanaka et al. |
| 2007/0091945 A1 | 4/2007 | Ferstl |
| 2007/0159636 A1 | 7/2007 | Jayaraman |

FOREIGN PATENT DOCUMENTS

| | | |
|---|---|---|
| EP | 1 863 022 | 12/2007 |
| JP | 2006 237418 | 9/2006 |
| JP | 2006-351847 | 12/2006 |

\* cited by examiner

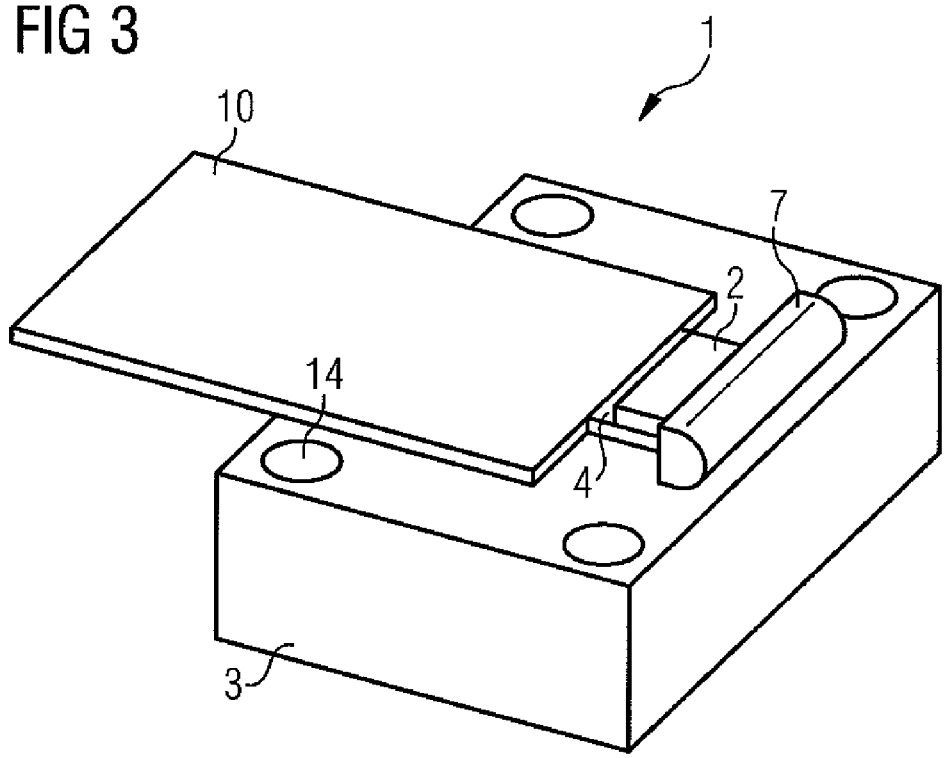
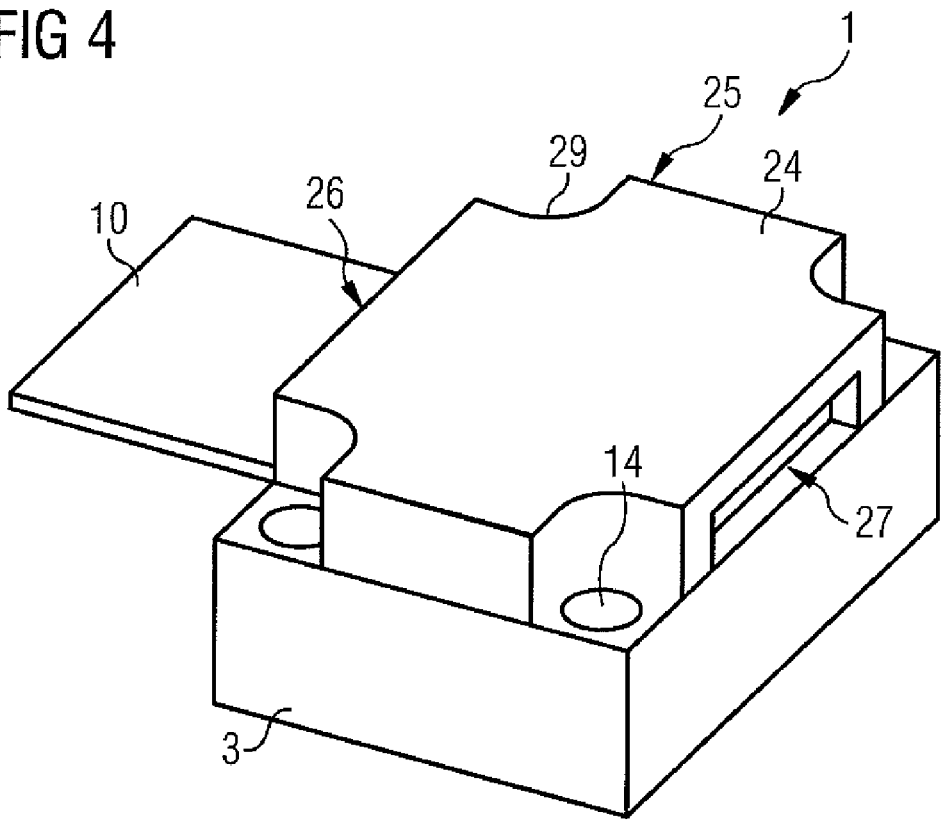

SEMICONDUCTOR LASER DEVICE

RELATED APPLICATIONS

This is a U.S. national stage of application No. PCT/DE2008/001910, filed on Nov. 19, 2008.

FIELD OF THE INVENTION

The invention relates to a semiconductor laser device comprising a laser bar.

This patent application claims priority from German patent application 10 2007 062 044.8 filed Dec. 21, 2007, whose disclosure content is hereby included by reference.

The emission characteristics of a laser diode depends on the temperature of the laser diode. The warmer the laser diode becomes, the more the emission characteristics is shifted towards a longer wavelength. It is therefore necessary, in particular for long-term operation of a laser diode, to provide for suitable removal of the heat produced during operation of the laser diode. This applies in particular to laser bars, which consist of a plurality of laser diodes grown on the same substrate.

The heat is usually removed by microcooling systems, which for example comprise microchannels through which a cooling liquid flows.

SUMMARY OF THE INVENTION

One object of the present invention is to provide a semiconductor laser device with a laser bar, which device is of small structural size and provides efficient cooling of the laser bar. It is also intended to provide an advantageous method for the production thereof.

According to an embodiment of the invention a semiconductor laser device comprises a laser bar, a flexible conductor support, a supporting body of a metal or a metal alloy and a heat sink, which is arranged between the supporting body and the laser bar, the laser bar being electrically contacted by the flexible conductor support and the supporting body having a thickness of at least 2 mm.

The supporting body of a metal or a metal alloy with a thickness of at least 2 mm provides good heat removal by means of high thermal conductivity.

An advantageous feature of using the flexible conductor support is that the laser bar may be arranged on the supporting body and contacted by the flexible conductor support in any desired way.

In one configuration the supporting body is of cuboidal construction. The supporting body preferably has a thickness of 3 mm to 4 mm. Particularly preferably, the thickness amounts to 0.35 to 0.65 times the side length of the base of the supporting body. The thickness of the supporting body is taken to mean the distance between the face of the supporting body on which the laser bar is arranged and the opposing base.

Efficient heat removal is achieved for the laser bar through selection of the material of the heat sink. A material is preferably used for the heat sink which is adapted to the thermal expansion of the laser bar, particularly preferably copper tungsten (CuW).

The heat is transferred by means of the heat sink from the laser bar to the supporting body. It is advantageous in this case for the heat to be distributed as uniformly as possible over the side remote from the laser bar, this being achieved by a sufficient thickness of the supporting body. The thickness of the supporting body results in good areal spread of the dissipated thermal energy.

The supporting body comprises for example a base opposite the laser bar which acts as a thermal emission surface of the semiconductor laser. At the base the supporting body may for example be connected to a cooling device, in particular to an actively cooled heat sink in the form of a microchannel cooler, through which a coolant flows. It is additionally advantageous to arrange an electrical insulator at the thermal emission surface on the base of the supporting body remote from the laser bar. The electrical insulator preferably takes the form of a thin layer and for example allows electrically neutral connection of the semiconductor laser device to a cooling device.

In one advantageous configuration the supporting body contains or consists of copper. It is additionally advantageous for the heat sink to contain or consist of copper tungsten. Preferably, the laser bar is coupled to the heat sink by means of a hard solder layer, preferably of gold tin, and the heat sink is coupled to the supporting body by means of a further hard solder layer, preferably of gold tin.

In one advantageous configuration an optical element is arranged downstream of the laser bar in a main beam direction. The optical element advantageously serves in beam shaping of the radiation emitted by the laser bar.

The optical element may in this case comprise an optics holder, preferably of glass, so allowing particularly inexpensive production.

The optical element may additionally comprise one or more optical members, for example a diaphragm, a lens, a waveguide or combinations thereof. The optical member influences the emission characteristics of the light emitted by the laser bar, preferably by reflection at boundary surfaces and/or refraction. The optics holder may take the form of part of the supporting body.

Preferably, the supporting body is produced by metal injection moulding. Furthermore, the supporting body may be produced by diecasting or by milling.

Three-dimensional structures such as for example optics holders, diaphragms or planar mounting surfaces at different heights may be provided inexpensively during production of the supporting body by metal injection moulding or by diecasting. Furthermore, with these production methods fastening devices may be simply provided, for example holes may be provided for screw connections.

It is advantageous for the flexible conductor support to be adhesively bonded to the supporting body using an adhesive material and for an electrically conductive connection to be formed between the flexible conductor support and the supporting body. Furthermore, it is advantageous for the flexible conductor support to contact the laser bar electrically by means of wire connections and for an electrically conductive connection to be formed between the laser bar and the supporting body. Preferably, the adhesive material used to connect the flexible conductor support to the supporting body is a silver lacquer adhesive, and the material used to provide the electrically conductive connection between the laser bar and the supporting body is a gold tin solder.

It is advantageous for the flexible conductor support to comprise conductive tracks on the top thereof, which are connected electrically conductively to the laser bar, for example the cathode contact. In addition, the flexible conductor support preferably comprises further conductive tracks on the bottom thereof, which are connected electrically conductively to the supporting body, wherein an electrically conductive connection is provided between the laser bar, for example the anode contact, and the supporting body. Such an arrangement of the conductive tracks on the top and bottom of the flexible conductor support is particularly space-saving.

The laser bar preferably emits light in the visible spectral range. The semiconductor laser device may be used in this case for projection applications, for example for illuminating microdisplays.

In a further configuration the semiconductor laser device comprises a thermistor, the resistance of which depends on the temperature. The thermistor may in particular comprise an NTC resistor. The thermistor is preferably arranged in the vicinity of the laser bar on the same side as the latter on the supporting body and connected electrically conductively, for example by a copper wire, to conductors on the flexible conductor support. The thermistor serves to measure the temperature of the laser bar during operation. A circuit arrangement may be used to switch off the laser bar or reduce the operating current if overheating occurs.

The laser bar comprises for example a semiconductor layer sequence with an active layer and a growth substrate. It is advantageous for the growth substrate to be arranged on the side remote from the supporting body. In this way heat removal to the heat sink and the supporting body is improved.

The supporting body may take the form of part of a housing of the semiconductor laser device and the housing may comprise a cover arranged on the supporting body, the laser bar being arranged inside the housing of the semiconductor laser device. Preferably the optical element is also arranged inside the housing.

In a preferred configuration the housing formed of the supporting body and the cover encloses the laser bar, at least two openings being provided in the housing. The flexible conductor support is guided through one of the openings into the housing and contacts the laser bar by means of wire connections, the wire connections preferably being arranged in the housing. Through the other opening the radiation produced by the laser bar is emitted.

The laser bar, the optical element, the wire connections, the heat sink and the thermistor are preferably arranged inside the housing formed of the supporting body and the cover.

In a method according to the invention for producing a semiconductor laser device, which comprises a laser bar, a heat sink, a supporting body and a flexible conductor support, a synchronous soldering process is used to solder the laser bar to the heat sink by means of a hard solder layer and the heat sink to the supporting body by means of a further hard solder layer. The hard solder joints are produced at a soldering temperature of 250° C. or more, in particular at 350° C. to 400° C., and are distinguished by high stability in the event of temperature fluctuations.

Furthermore, the flexible conductor support is adhesively bonded to the supporting body preferably after completion of the synchronous soldering process.

BRIEF DESCRIPTION OF THE DRAWINGS

FIG. 3 is a schematic perspective representation of a second exemplary embodiment of a semiconductor laser device, FIG. 4 shows a further development of FIG. 3.

DETAILED DESCRIPTION OF THE DRAWINGS

Figure 1:
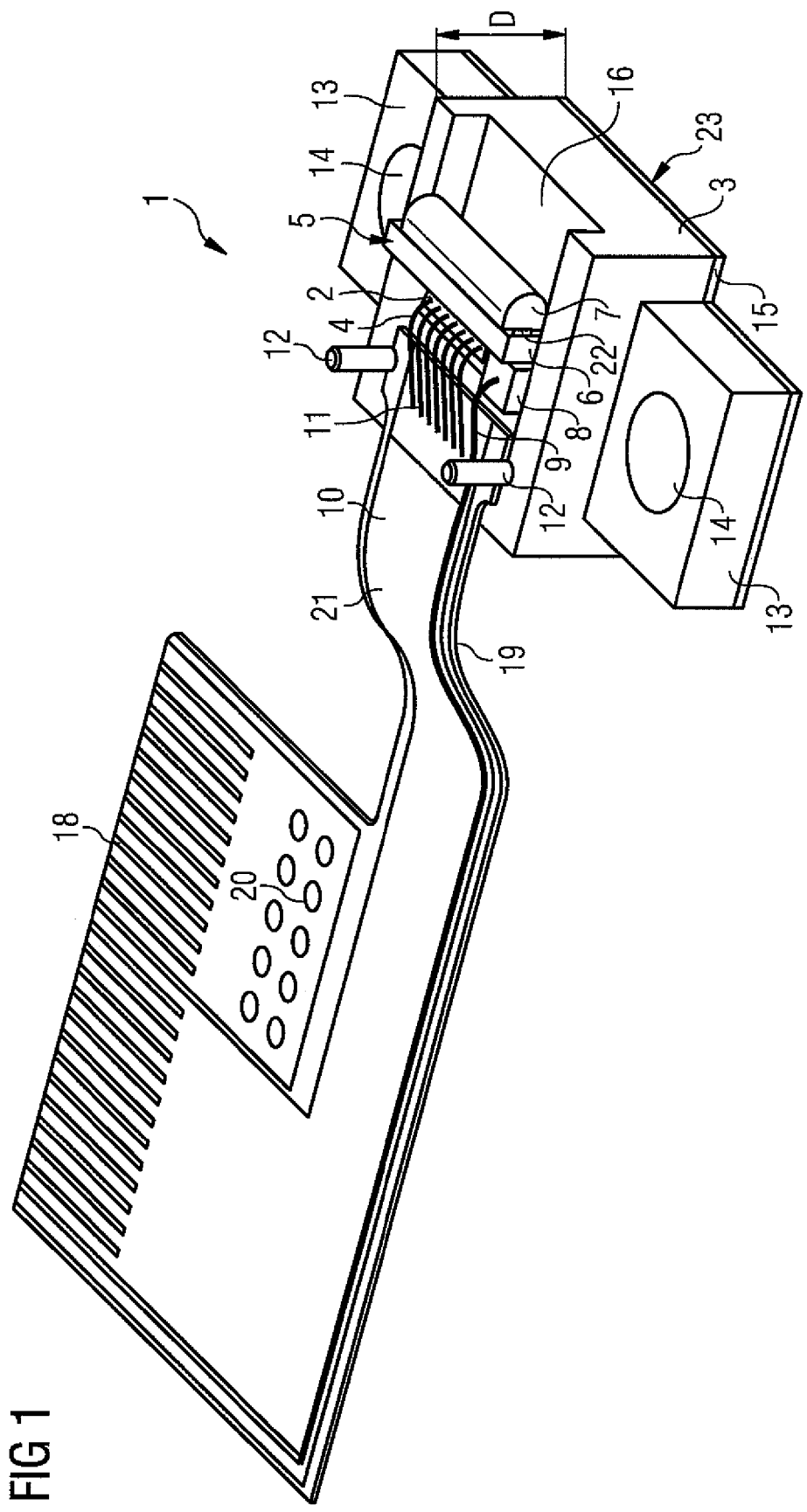
FIG. 1 is a schematic perspective representation of a semiconductor laser device according to a first exemplary embodiment.

Identical or identically acting elements are provided with identical reference numerals in the Figures. The Figures should not be considered as being to scale, but rather individual elements may be shown exaggeratedly large for the sake of clarity.

FIG. 1 shows an exemplary embodiment of a semiconductor laser device 1, which comprises a laser bar 2, which is arranged on a supporting body 3 of copper, a heat sink 4 of copper tungsten being arranged between the laser bar 2 and the supporting body 3.

The semiconductor laser device 1 further contains an optical element 5, which is arranged downstream of the laser bar 2. The optical element 5 comprises an optics holder 6 and an optical member 7.

The semiconductor laser device 1 additionally comprises a thermistor 8, which is arranged in the vicinity of the laser bar 2 on the same side of the supporting body 3 as the laser bar 2. The thermistor 8 is contacted electrically conductively for example by a copper wire 9.

Furthermore, the semiconductor laser device 1 comprises a flexible conductor support 10, which is connected electrically conductively to the laser bar 2 via wire connections 11. Dowel pins 12 serving to fasten a cover in place are arranged on the supporting body 3.

The semiconductor laser device 1 comprises fastening devices 13 projecting laterally out of the supporting body 2 and provided with screw holes 14.

The base of the supporting body 3 opposite the laser bar is preferably provided with an insulating layer 15.

The supporting body 3 is made of copper in this exemplary embodiment. It may alternatively comprise other metals or metal alloys.

The supporting body 3 is for example of cuboidal construction. The surface on which the laser bar 2 is arranged comprises for example a square base of approx. 50 cm$^2$.

The surface of the supporting body 3, on which the laser bar 2 is arranged, and the opposing base determine the thickness of the supporting body 3. The supporting body 3 is preferably 3 mm to 4 mm thick, so ensuring that the dissipated heat from the laser bar 2 is spread well over the opposite side from the laser bar 2. Heat removal through the supporting body 3 reduces the temperature in the active zone of the laser bar 2 advantageously to such an extent that a continuous load is possible over several 1000 hours with a high luminous efficiency.

The supporting body 3 is preferably produced by metal injection moulding. Metal injection moulding is a shaping process, with which large numbers of supporting bodies 3 may be produced with excellent tolerance. The starting material for the injection moulding of metal is metal powder of a suitable grain size. By slow heating, the metal powder is fused and injected by a machine into a mould.

Alternative production methods include diecasting and milling.

The supporting body 3 comprises a recess 16, an optics holder 6 and the dowel pins 12, which are co-moulded during metal injection moulding. The fastening devices 13 are also formed by metal injection moulding as part of the supporting body 3.

The thickness D of the supporting body 3 advantageously amounts to 35% to 65% of the side length of the base of the supporting body. The thickness D preferably amounts to at least 2 mm and particularly preferably to 3 mm to 4 mm. The thickness of the supporting body is here taken to mean the distance between the surface of the supporting body 3 on which the laser bar is arranged and the opposing base of the supporting body 3. Shaped elements of the supporting body such as the dowel pins 12 or the optics holder 6 in particular are not taken into account when determining the thickness.

The flexible conductor support 10 preferably comprises a polyimide film around 100 µm thick and copper conductive tracks (not shown) with a thickness of for example 50 µm to 100 µm, which are preferably applied onto the polyimide film by electrodeposition. The conductive tracks are preferably covered with a protective coating. The conductive tracks of the flexible conductor support 10 are preferably dimensioned for a current flow of 2 A to 10 A.

Furthermore, the flexible conductor support 10 may comprise a plug-in contact with terminals 18, whereby it may be used in particular as a plug-in element in a zero force plug connector. Alternatively the flexible conductor support 10 may be soldered onto an electronic printed circuit board, electrical connection in this case taking place pluglessly.

On the bottom 19 the flexible conductor support 10 comprises an anode terminal contact. This is adhesively bonded over a large area to the supporting body 3 by means of an adhesive material. Conductive silver adhesive is preferably used as the adhesive material.

At plated-through points 20 anode conductive tracks are re-routed from the bottom 19 to the top 21 of the flexible conductor support 10, where the anode conductive tracks continue parallel beside the cathode conductive tracks. Because both the bottom 19 and the top 21 of the flexible conductor support 10 are used for the conductive tracks in the vicinity of the semiconductor laser device 1, the width of the flexible conductor support 10 may be kept small in the vicinity of the semiconductor laser device 1.

The cathodes of the laser bar 2 are connected electrically to the flexible conductor support 10 by means of the wire connections 11. They take the form, for example, of gold wires with a thickness of approx. 50 µm. When connecting the gold wires to the flexible conductor support 10, one end of a gold wire is firstly fused, such that it forms a ball. By applying ultrasound at approx. 30 KHz, the end is rubbed against the flexible conductor support 10 and then hardened. Contacting of the laser bar 2 with the gold wire is effected by shearing off the gold wire and applying ultrasound at approx. 30 KHz.

The optics holder 6 takes the form of a lens holder and preferably consists of glass. Adhesively bonded to the optics holder 6 is an optical member 7, which takes the form of a fast axis collimation lens (FAC lens). The FAC lens collimates the highly divergent radiation emitted by the laser bar 2. Mounting the lens requires a great degree of precision. The smallest possible displacement of the lens must be achieved during mounting. To fasten the lens to the optics holder 6, thin columns of adhesive are used, which display only slight shrinkage on hardening and only slight expansion when in operation. The thicknesses of the columns of adhesive amount to between 5 µm and 20 µm.

The thermistor 8 takes the form of an NTC resistor, for example, the resistance of which falls when the temperature rises. Electrical interconnection of the thermistor 8 serves in determining the temperature in the vicinity of the laser bar 2. In the event of overheating the semiconductor laser device may be switched off, the overheating being detectable by the thermistor 8.

If electrical current causes the laser bar 2 to emit laser beams, heat arises, which flows away via the heat sink 4 to the supporting body 3. Further removal of the dissipated heat may proceed at the bottom 23 of the supporting body 3 by fitting a cooling device, which comprises heat pipes or a fan, for example.

Figure 2:
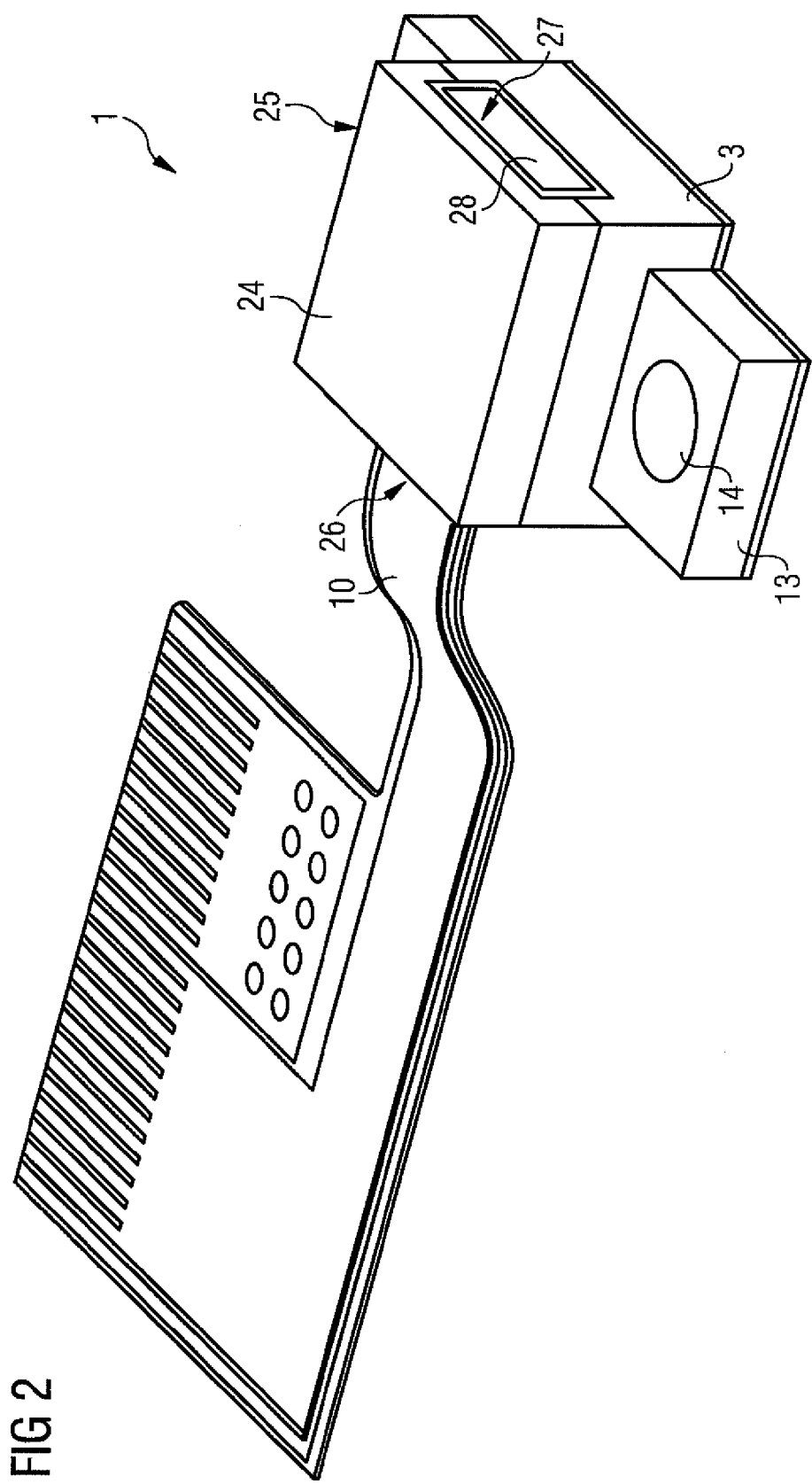
FIG. 2 shows a further development of FIG. 1.

FIG. 2 shows a further development of the semiconductor laser device of FIG. 1. The semiconductor laser device 1 comprises a cover 24, which is arranged on the supporting body 3. The cover 24 is firmly connected to the supporting body 3. The cover 24 and the supporting body 3 enclose the laser bar and the wire connections, the optical element and the thermistor (none of which are illustrated) and in this way form a housing 25 for the components.

The flexible conductor support 10 extends through a first opening 26 into the housing 25, where it electrically contacts the laser bar (not shown). On the opposite side from the first opening 26 a second opening 27 is provided, into which a window 28 is inserted. The window 28 takes the form of a glass window with an antireflective coating. It follows the optical element (not shown) in the direction of propagation of the laser light. The radiation from the semiconductor laser device 1 exits through the second opening 27.

The housing 25 protects the sensitive laser bar from dust and other environmental influences.

The fastening devices 13 of the supporting body comprise screw holes 14, by means of which the semiconductor laser device 1 may be screwed to a cooling device (not shown). This makes it possible to achieve fixed, reliable thermal coupling of the semiconductor laser device 1 to a cooling system, for example comprising a heat pipe, a dissipater and/or a fan.

FIG. 3 shows a further exemplary embodiment of a semiconductor laser device 1, which comprises a flexible conductor support 10, of which only a portion is shown and which is stuck to the supporting body 3. The supporting body 3 takes the form of a cuboid without recess. The optical member 7 is arranged on the supporting body 3 without optics holder. The semiconductor laser device 1 comprises four screw holes 14 in the corners of the supporting body 3, by means of which the semiconductor laser device 1 may be coupled to a cooling system.

The laser bar 2 is connected thermally to the supporting body 3 via a heat sink 4. Electrical contacting of the laser bar 2 by the flexible conductor support 10 is not shown, but may proceed for example as shown in the exemplary embodiment illustrated in FIG. 1.

FIG. 4 shows a further development of the exemplary embodiment illustrated in FIG. 3, in which the housing 25 comprises a cover 24, which is firmly connected to the supporting body 3. The cover 24 comprises recesses 29 at its corners, which make accessible screw holes 14 in the supporting body 3, through which the semiconductor laser device 1 may for example be fixed to a cooling system.

The opening 26 in the housing 25 assists in electrical contacting by the flexible conductor support 10 and the opening 27 assists in the emission of radiation by the semiconductor laser device 1.

Figure 5:
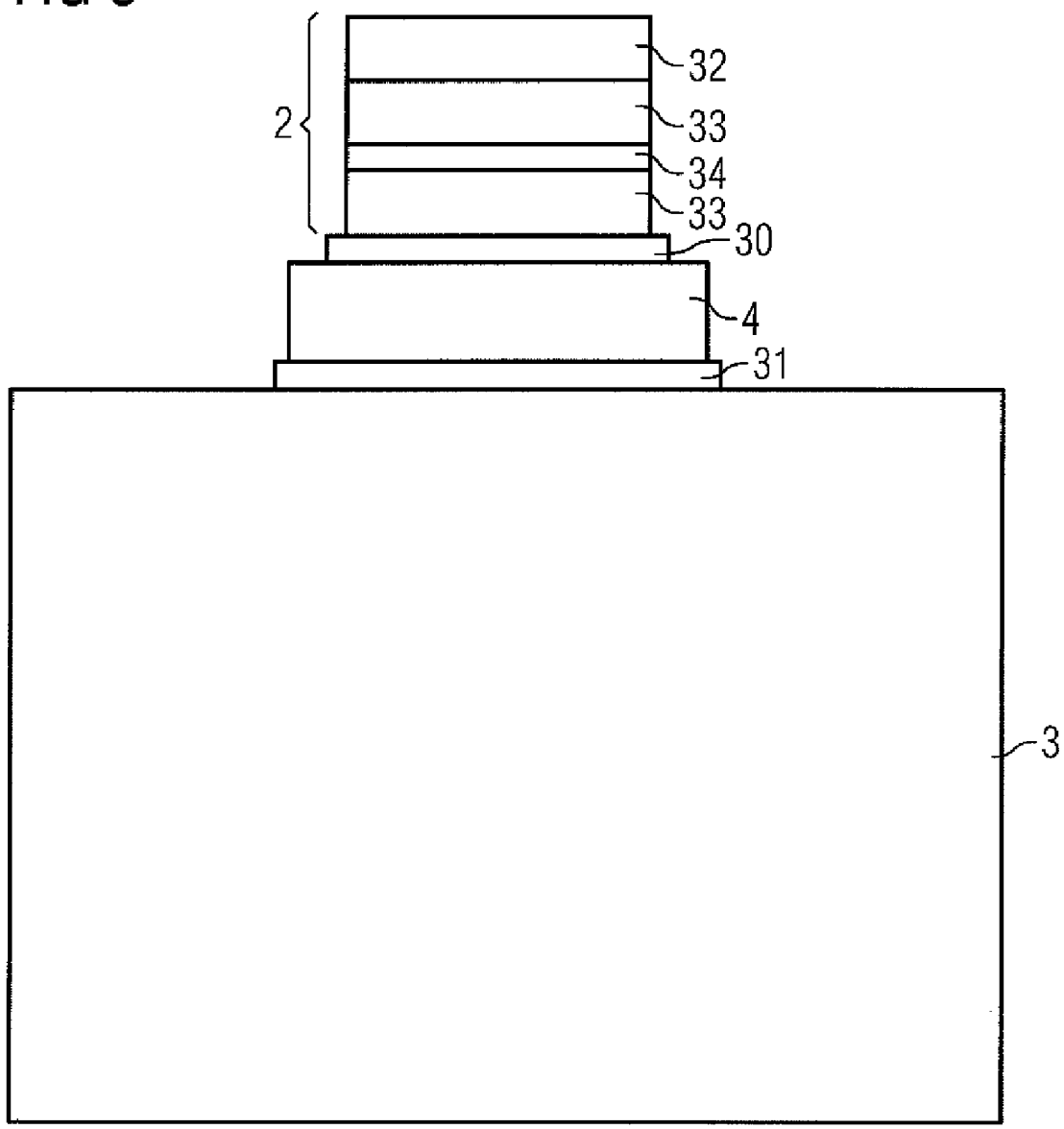
FIG. 5 is a schematic sectional representation of a further exemplary embodiment of a semiconductor laser device.

FIG. 5 is a schematic sectional view of a further semiconductor laser device with a laser bar 2, a heat sink 4 and a supporting body 3.

The laser bar 2 is soldered to the heat sink 4 by means of a hard solder layer 30 and the heat sink is soldered to the supporting body 3 by a further hard solder layer 31. The two hard solder joints are preferably produced using a synchronous soldering method.

The laser bar 2 comprises a growth substrate 32 and epitaxial layers 33, 34, which include an active layer 34. The epitaxial layers 33, 34 preferably contain at least one III-V semiconductor material, in particular $In_xGa_yAl_{1-x-y}P$, $In_xGa_yAl_{1-x-y}N$ or $In_xGa_yAl_{1-x-y}As$, in each case with $0 \leq x \leq 1$, $0 \leq y \leq 1$ and $x+y \leq 1$ The laser bar 2 may emit light for example in the wavelength range from 630 to 645 nm. With high current intensities of 0.1 A to 10 A, light outputs of 2 W to 10 W or more may advantageously be produced.

The laser bar 2 is preferably arranged "upside down" on the heat sink 4, i.e. the growth substrate 32 is arranged on a side of the laser bar 2 remote from the heat sink 4 and the active layer 34 is arranged on a side of the laser bar 2 facing the heat sink 4. This results in direct coupling of the active layer 34 of the laser bar 2 with the heat sink 4.

The heat sink 4 is arranged between the laser bar 2 and the supporting body 3 and fastened to the laser bar 2 and to the supporting body 3 by the hard solder layers 30, 31. During the soldering process temperatures of 350° C. to 400° C. are briefly reached, so achieving high mechanical stability for the soldered material and at the same time producing an electrically conductive connection.

Gold tin is preferably used for the hard solder layers 30, 31. The hard solder layers are distinguished in particular by high cycle strength.

The invention is not restricted to the description given with reference to the exemplary embodiments. Rather, the invention encompasses any novel feature and combinations of features, including in particular any combination of features in the claims, even if this feature or this combination of features is not explicitly indicated in the claims or exemplary embodiments.

The invention claimed is:

1. A semiconductor laser device comprising:
   a laser bar;
   a flexible conductor support;
   a supporting body of a metal or a metal alloy;
   a heat sink, which is arranged between the supporting body and the laser bar;
   a first hard solder layer that connects the laser bar to the heat sink; and
   a second hard solder layer that connects the heat sink to the supporting body,
   wherein the laser bar is electrically contacted by the flexible conductor support, and the supporting body has a thickness of at least 2 mm, and
   wherein the flexible conductor support comprises conductive tracks on the top thereof, which are connected electrically conductively to the laser bar, and comprises further conductive tracks on the bottom thereof, which are connected electrically conductively to the supporting body, and an electrically conductive connection is provided between the laser bar and the supporting body.

2. The semiconductor laser device according to claim 1, wherein the supporting body has a thickness of 3 mm to 4 mm.

3. The semiconductor laser device according to claim 1, wherein the heat sink contains copper tungsten.

4. The semiconductor laser device according to claim 1, having an optical element, which is arranged downstream of the laser bar in a main beam direction.

5. The semiconductor laser device according to claim 1, wherein the flexible conductor support is adhesively bonded to the supporting body using an adhesive material and an electrically conductive connection is formed between the flexible conductor support and the supporting body.

6. The semiconductor laser device according claim 1, wherein the flexible conductor support electrically contacts the laser bar by means of wire connections.

7. The semiconductor laser device according to claim 1, having an electrical insulating layer, which is arranged on the side of the supporting body remote from the laser bar.

8. The semiconductor laser device according to claim 1, having a thermistor, which is arranged on the supporting body.

9. The semiconductor laser device according to claim 1, wherein the laser bar comprises a growth substrate, which is arranged on the side of the laser bar remote from the supporting body.

10. The semiconductor laser device according to claim 1, wherein the supporting body takes the form of part of a housing of the semiconductor laser device and the housing comprises a cover arranged on the supporting body, the laser bar being arranged inside the housing of the semiconductor laser device.

11. The semiconductor laser device according to claim 4, wherein the supporting body takes the form of part of a housing of the semiconductor laser device and the housing comprises a cover arranged on the supporting body, the laser bar and the optical element being arranged inside the housing of the semiconductor laser device.

12. The semiconductor laser device according to claim 6, wherein the supporting body takes the form of part of a housing of the semiconductor laser device and the housing comprises a cover arranged on the supporting body, the laser bar and the wire connections being arranged inside the housing of the semiconductor laser device.

13. A method for producing a semiconductor laser device according to claim 1, wherein a synchronous soldering process is used to solder the laser bar to the heat sink by means of the first hard solder layer and the heat sink to the supporting body by means of the second hard solder layer.

14. The method according to claim 13, wherein the flexible conductor support is adhesively bonded to the supporting body, once the synchronous soldering process is complete.

15. A semiconductor laser device comprising:
   a laser bar;
   a flexible conductor support;
   a supporting body of a metal or a metal alloy;
   an electrical insulating layer arranged on the side of the supporting body remote from the laser bar;
   a heat sink, which is arranged between the supporting body and the laser bar;
   a first hard solder layer that connects the laser bar to the heat sink; and
   a second hard solder layer that connects the heat sink to the supporting body,
   wherein the laser bar is electrically contacted by the flexible conductor support, and the supporting body has a thickness of at least 2 mm.

16. The semiconductor laser device according to claim 15, wherein the flexible conductor support is adhesively bonded to the supporting body using an adhesive material and an electrically conductive connection is formed between the flexible conductor support and the supporting body.

17. The semiconductor laser device according claim 15, wherein the flexible conductor support electrically contacts the laser bar by means of wire connections.

18. A semiconductor laser device comprising:
   a laser bar;
   a flexible conductor support;
   a supporting body of a metal or a metal alloy;
   a heat sink, which is arranged between the supporting body and the laser bar;
   a thermistor arranged on the supporting body;
   a first hard solder layer that connects the laser bar to the heat sink; and a second hard solder layer that connects the heat sink to the supporting body, wherein the laser bar is electrically contacted by the flexible conductor support, and the supporting body has a thickness of at least 2 m.

19. The semiconductor laser device according to claim 18, having an electrical insulating layer, which is arranged on the side of the supporting body remote from the laser bar.

20. The semiconductor laser device according to claim 18, wherein the supporting body takes the form of part of a housing of the semiconductor laser device and the housing comprises a cover arranged on the supporting body, the laser bar being arranged inside the housing of the semiconductor laser device.

* * * * *

UNITED STATES PATENT AND TRADEMARK OFFICE
CERTIFICATE OF CORRECTION

| | | |
|---|---|---|
| PATENT NO. | : 8,411,715 B2 | Page 1 of 1 |
| APPLICATION NO. | : 12/809677 | |
| DATED | : April 2, 2013 | |
| INVENTOR(S) | : Frank Singer | |

It is certified that error appears in the above-identified patent and that said Letters Patent is hereby corrected as shown below:

In the Claims:

Col. 8-9, Claim 18 should read as follows:

18. A semiconductor laser device comprising:
a laser bar;
a flexible conductor support;
a supporting body of a metal or a metal alloy;
a heat sink, which is arranged between the supporting body and the laser bar;
a thermistor arranged on the supporting body;
a first hard solder layer that connects the laser bar to the heat sink; and
a second hard solder layer that connects the heat sink to the supporting body,
wherein the laser bar is electrically contacted by the flexible conductor support, and the supporting body has a thickness of at least 2 mm.

Signed and Sealed this
Ninth Day of July, 2013

Teresa Stanek Rea
*Acting Director of the United States Patent and Trademark Office*